United States Patent
Hu et al.

(10) Patent No.: US 8,604,802 B2
(45) Date of Patent: Dec. 10, 2013

(54) CHECKING CIRCUIT FOR SERIAL PORT CONNECTORS

(75) Inventors: Wen-Sen Hu, Shenzhen (CN); Ting Ge, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 338 days.

(21) Appl. No.: 13/093,870

(22) Filed: Apr. 26, 2011

(65) Prior Publication Data
US 2012/0242347 A1    Sep. 27, 2012

(30) Foreign Application Priority Data
Mar. 25, 2011   (CN) .......................... 2011 1 0073106

(51) Int. Cl.
*G01R 31/04*    (2006.01)

(52) U.S. Cl.
USPC ........................... 324/538; 324/542; 324/500

(58) Field of Classification Search
None
See application file for complete search history.

(56) References Cited

U.S. PATENT DOCUMENTS 6,198,403 B1 *   3/2001   Dorrough et al. ............. 340/635
7,015,686 B1 *   3/2006   Wu ........................... 324/756.05
8,479,593 B1 *   7/2013   Kudo ............................... 73/861

* cited by examiner

*Primary Examiner* — Jermele M Hollington
*Assistant Examiner* — Trung Nguyen
(74) *Attorney, Agent, or Firm* — Altis Law Group, Inc.

(57) ABSTRACT

A checking circuit for a serial port connector includes a first inverter, a second inverter, a third inverter, and a first light emitting diode (LED) and a second LED with different colors. An input of the first inverter is connected to a transmitted data pin of the serial port connector. An output of the first inverter is connected to an anode of the first LED. An input of the second inverter is connected to the transmitted data pin of the serial port connector. An output of the second inverter is connected to an input of the third inverter. An output of the third inverter is connected to an anode of the second LED. Cathodes of the first and second LEDs are grounded.

12 Claims, 3 Drawing Sheets

CHECKING CIRCUIT FOR SERIAL PORT CONNECTORS

BACKGROUND

1. Technical Field

The present disclosure relates to a checking circuit for serial port connectors.

2. Description of Related Art

When a serial port connector is not working properly, testers usually manually check pins of the serial port connector with a multimeter, which is inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
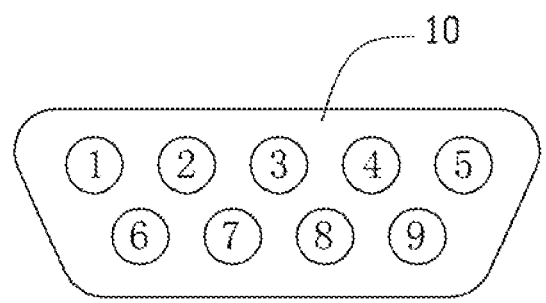
FIG. 1 is a schematic diagram of a serial port connector.

Referring to FIG. 1, a serial port connector 10 includes nine pins 1-9. The pin 1 is a data carrier detect (DCD) pin. The pin 2 is a received data (RxD) pin. The pin 3 is a transmitted data (TxD) pin. The pin 4 is a data terminal ready (DTR) pin. The pin 5 is a common ground (GND) pin. The pin 6 is a data set ready (DSR) pin. The pin 7 is a request to send (RTS) pin. The pin 8 is a clear to send (CTS) pin. The pin 9 is a ring indicator (RI) pin. According to characteristic of serial port connectors, when the RxD pin receives signals, a voltage level at the RxD pin is between +3 volts (V) and +15V When the RxD pin does not receive signals, a voltage level at the RxD pin is between −3V and −15V. When the TxD pin transmits signals, a voltage level at the TxD pin is between +3V and +15V. When the TxD pin does not transmit signals, a voltage level at the TxD pin is between −3V and −15V.

Figure 2:
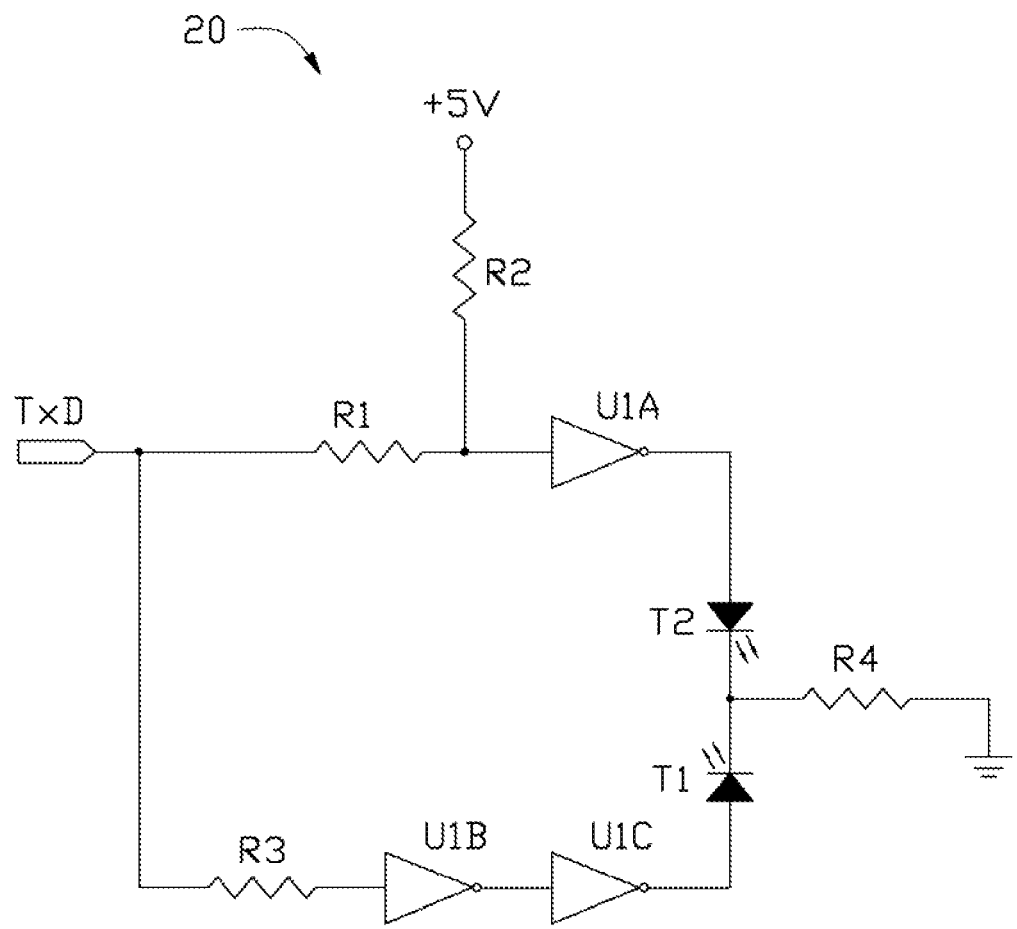
FIGS. 2 and 3 are circuit diagrams of an exemplary embodiment of a checking circuit for the serial port connector of FIG. 1.
Figure 3:
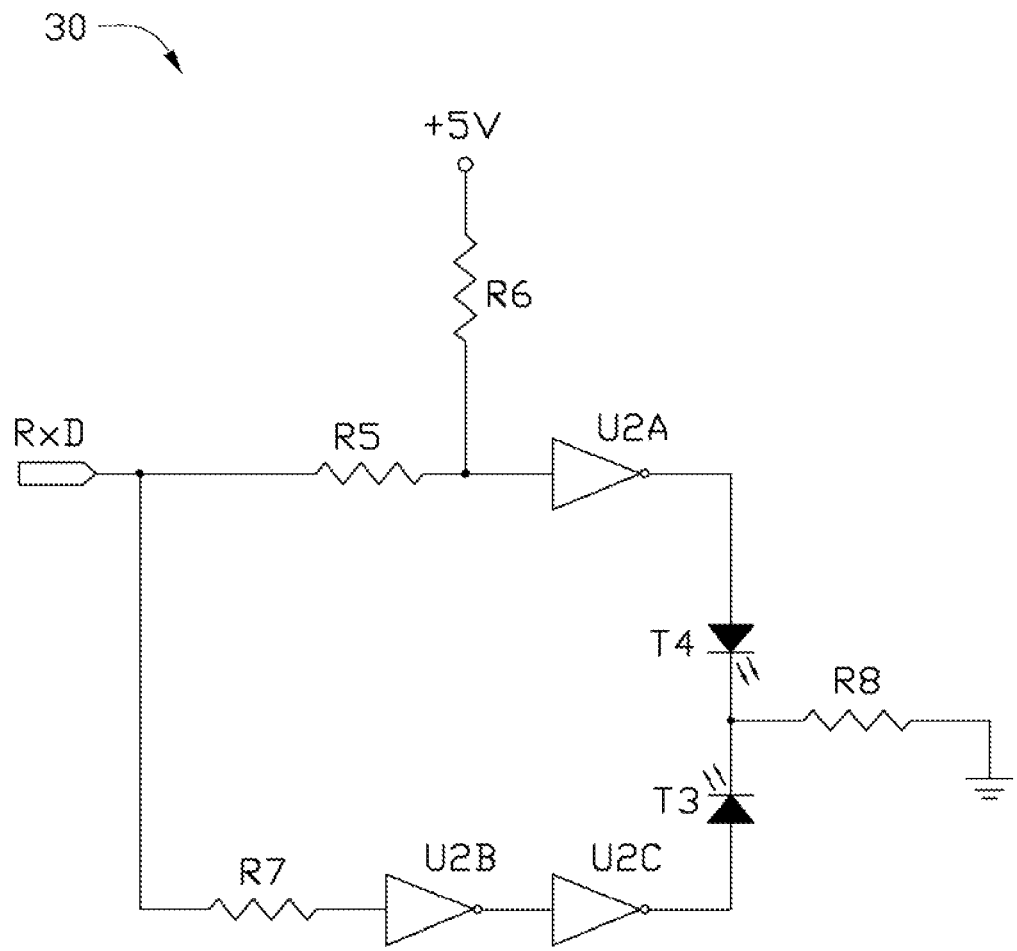

Referring to FIGS. 2 and 3, an exemplary embodiment of a checking circuit for the serial port connector 10 includes a first circuit 20 and a second circuit 30. The first circuit 20 checks the TxD pin of the serial port connector 10. The second circuit 30 checks the RxD pin of the serial port connector 10.

The first circuit 20 includes three inverters U1A, U1B, and U1C, a green light emitting diode (LED) T1, and a red LED T2. An input of the inverter U1A is connected to the TxD pin of the serial port connector 10 through a resistor R1. An output of the inverter U1A is connected to an anode of the red LED T2. A node between the resistor R1 and the inverter U1A is connected to a +5 volt (V) power supply through a resistor R2. An input of the inverter U1B is connected to the TxD pin of the serial port connector 10 through a resistor R3. An output of the inverter U1B is connected to an input of the inverter U1C. An output of the inverter U1C is connected to an anode of the green LED T1. Cathodes of the green LED T1 and the red LED T2 are grounded through a resistor R4.

When the TxD pin of the serial port connector 10 works properly, the TxD pin transmits signals. Accordingly, a voltage level at the TxD pin is between +3V and +15V. In the embodiment, the voltage level at the TxD pin is assumed to be +3V. At this time, the output of the inverter U1A outputs a low level voltage. The anode of the red LED T2 is at a low level voltage. The red LED T2 does not light. At the same time, the output of the inverter U1C outputs a high level voltage. The anode of the green LED T1 is at a high level voltage. The green LED T1 lights.

When the TxD pin of the serial port connector 10 is not working properly, the TxD pin does not transmit signals. Accordingly, a voltage level at the TxD pin is between −3V and −15V. In the embodiment, the voltage level at the TxD pin is regarded as −3V. At this time, the output of the inverter U1A outputs a high level voltage. The anode of the red LED T2 is at a high level voltage, and the red LED T2 lights. At the same time, the output of the inverter U1C outputs a low level voltage. The anode of the green LED T1 is at a low level voltage. The green LED T1 does not light. In the first circuit 20, the resistor R2 is a pull-up resistor for providing enough voltage to light the green LED T1 or the red LED T2.

The second circuit 30 includes three inverters U2A, U2B, and U2C, a green LED T3, and a red LED T4.

When the RxD pin of the serial port connector 10 is working properly, the RxD pin receives signals. Accordingly, a voltage level at the RxD pin is between +3V and +15V. In the embodiment, the voltage level at the RxD pin is regarded as +3V. At this time, the output of the inverter U2A outputs a low level voltage. The anode of the red LED T4 is at a low voltage level, and the red LED T4 does not light. At the same time, the output of the inverter U2C outputs a high level voltage. The anode of the green LED T3 is at a high voltage level, and the green LED T3 lights.

When the received RxD pin of the serial port connector 10 is not working properly, the RxD pin does not transmit signals. Accordingly, a voltage level at the RxD pin is between −3V and −15V. In the embodiment, the voltage level at the RxD pin is regarded as −3V. At this time, the output of the inverter U2A outputs a high level voltage. The anode of the red LED T4 is at a high voltage level, and the red LED T4 lights. At the same time, the output of the inverter U2C outputs a low level voltage. The anode of the green LED T3 is at a low voltage level, and the green LED T3 does not light. In the second circuit 30, the resistor R6 is a pull-up resistor for providing enough voltage to light the green LED T3 or the red LED T4.

Moreover, when the TxD pin of the serial port connector 10 is not working properly, the RxD pin cannot receive any signals regardless of whether the RxD pin is working or not. At this time, the red LEDs T2 and T4 light.

According to the description above, if the two green LEDs T1 and T3 are both lit, it is indicated that the TxD pin and the RxD pin both work. If the green LED T1 and the red LED T4 light, it indicates that the TxD pin works, and the RxD pin does not work. If the red LEDs T2 and T4 are both lit, it indicates that the TxD pin does not work.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A checking circuit for a serial port connector, the checking circuit comprising:
a first circuit comprising a first inverter, a second inverter, a third inverter, and a first light emitting diode (LED) and a second LED with different colors, wherein an input of the first inverter is connected to a transmitted data pin of the serial port connector, an output of the first inverter is connected to an anode of the first LED, an input of the second inverter is connected to the transmitted data pin of the serial port connector, an output of the second inverter is connected to an input of the third inverter, an output of the third inverter is connected to an anode of the second LED, cathodes of the first and second LEDs are grounded.

2. The checking circuit of claim 1, wherein a node between the input of the first inverter and the transmitted data pin of the serial port connector is connected to a power supply through a pull-up resistor.

3. The checking circuit of claim 1, wherein the input of the first inverter is connected to the transmitted data pin of the serial port connector through a first resistor, the input of the second inverter is connected to the transmitted data pin of the serial port connector through a second resistor.

4. The checking circuit of claim 1, wherein the cathodes of the first and second LEDs are grounded through a resistor.

5. The checking circuit of claim 1, further comprising a second circuit ,wherein the second circuit comprises a fourth inverter, a fifth inverter, a sixth inverter, and a third LED and a fourth LED with different colors, an input of the fourth inverter is connected to a received data pin of the serial port connector, an output of the fourth inverter is connected to an anode of the third LED, an input of the fifth inverter is connected to the received data pin of the serial port connector, an output of the fifth inverter is connected to an input of the sixth inverter, an output of the sixth inverter is connected to an anode of the fourth LED, cathodes of the third and fourth LEDs are grounded.

6. The checking circuit of claim 5, wherein a node between the input of the fourth inverter and the received data pin of the serial port connector is connected to the power supply through a pull-up resistor.

7. The checking circuit of claim 5, wherein the input of the fourth inverter is connected to the received data pin of the serial port connector through a first resistor, the input of the fifth inverter is connected to the received data pin of the serial port connector through a second resistor.

8. The checking circuit of claim 5, wherein the cathodes of the third and fourth LEDs are grounded through a resistor.

9. A checking circuit for a serial port connector, the checking circuit comprising:
a first circuit comprising a first inverter, a second inverter, a third inverter, and a first light emitting diode (LED) and a second LED with different colors, an input of the first inverter is connected to a received data pin of the serial port connector, an output of the first inverter is connected to an anode of the first LED, an input of the second inverter is connected to the received data pin of the serial port connector, an output of the second inverter is connected to an input of the third inverter, an output of the third inverter is connected to an anode of the second LED, cathodes of the first and second LEDs are grounded.

10. The checking circuit of claim 9, wherein a node between the input of the first inverter and the received data pin of the serial port connector is connected to a power supply through a pull-up resistor.

11. The checking circuit of claim 9, wherein the input of the first inverter is connected to the received data pin of the serial port connector through a first resistor, the input of the second inverter is connected to the received data pin of the serial port connector through a second resistor.

12. The checking circuit of claim 9, wherein the cathodes of the first and second LEDs are grounded through a resistor.

* * * * *